(12) United States Patent
Bas et al.

(10) Patent No.: US 7,598,818 B2
(45) Date of Patent: Oct. 6, 2009

(54) TEMPERATURE COMPENSATION FOR A VOLTAGE-CONTROLLED OSCILLATOR

(75) Inventors: Gilles Bas, Beauvoisin (FR); Vincent Cheynet De Beaupre, Marseilles (FR); Zaid Lakhdar, Saint-Cyr/mer (FR); Weneestas Rahajandraibe, Marseilles (FR)

(73) Assignees: STMicroelectronics SAS, Rousset (FR); Universite de Provence (Aix-Marseille I), Marseille Cedex (FR)

( * ) Notice: Subject to any disclaimer, the term of this patent is extended or adjusted under 35 U.S.C. 154(b) by 0 days.

(21) Appl. No.: 11/226,051

(22) Filed: Sep. 14, 2005

(65) Prior Publication Data

US 2006/0097805 A1    May 11, 2006

(30) Foreign Application Priority Data

Sep. 14, 2004   (FR) ................... 04 09725

(51) Int. Cl.
*H03L 1/02*        (2006.01)
*H03L 7/099*       (2006.01)
(52) U.S. Cl. ................. 331/57; 331/66; 331/176; 331/185
(58) Field of Classification Search ............... 331/57, 331/66, 176, 185
See application file for complete search history.

(56) References Cited

U.S. PATENT DOCUMENTS

| 5,180,995 | A   |   | 1/1993  | Hayashi et al. |
| 5,359,301 | A   |   | 10/1994 | Candage |
| 5,426,398 | A   | * | 6/1995  | Kuo .............................. 331/57 |
| 5,686,867 | A   |   | 11/1997 | Sutardja et al. |
| 5,870,004 | A   |   | 2/1999  | Lu |
| 6,192,220 | B1  | * | 2/2001  | Henwood et al. ............. 455/76 |
| 6,351,191 | B1  |   | 2/2002  | Nair et al. |
| 7,050,777 | B2  | * | 5/2006  | Cai .............................. 455/295 |
| 2002/0175729 | A1 |  | 11/2002 | Cyrusian |

FOREIGN PATENT DOCUMENTS

| EP | 0 580 209 | 1/1994 |
| EP | 0 901 127 | 3/1999 |

OTHER PUBLICATIONS

J. Hauenschild et al., "A Two-Chip Receiver for Short Haul Links Up To 3.5Gb/s with PIN-Preamp Module and CDR-DMUX", ISSCC98, Session 19, Multi-Gigahertz Serial Data, Paper SA, 1994.
French Preliminary Search Report dated Apr. 15, 2005 for French Application No. 04 09725.

* cited by examiner

*Primary Examiner*—Robert Pascal
*Assistant Examiner*—James E Goodley
(74) *Attorney, Agent, or Firm*—Lisa K. Jorgenson; Stephen Bongini; Fleit Gibbons Gutman Bongini & Bianco P.L.

(57) ABSTRACT

An oscillator is provided that includes an oscillating structure generating an output signal with a frequency that drifts as a function of a parameter of its environment, and a compensation circuit coupled to the oscillating structure. The oscillating structure has a ring structure that includes delay cells looped together, and the compensation circuit supplies a compensation signal to the oscillating structure. The compensation signal varies as a function of changes in the parameter in order to compensate for the drift in the frequency of the generated signal. This makes it possible to compensate for oscillator temperature drifts in the absence of a regulation loop.

28 Claims, 6 Drawing Sheets

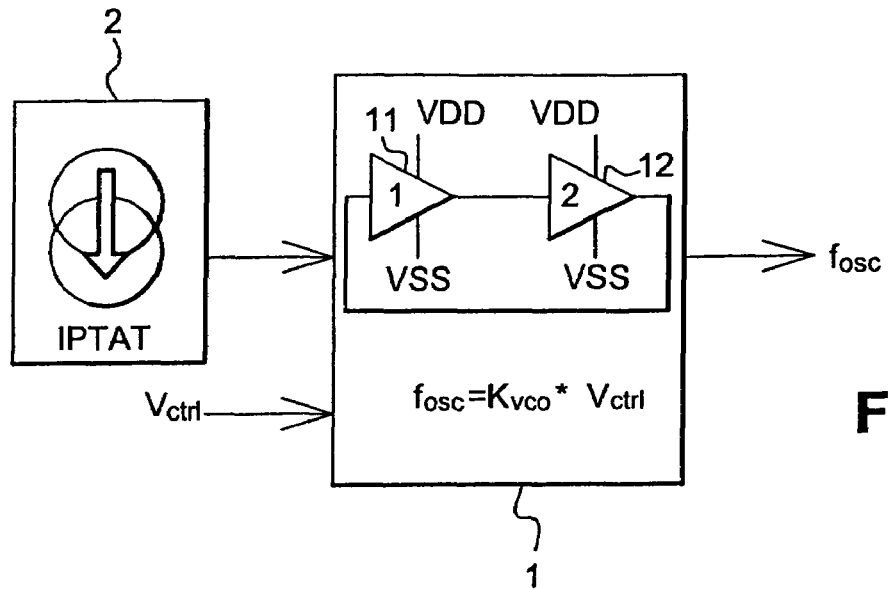
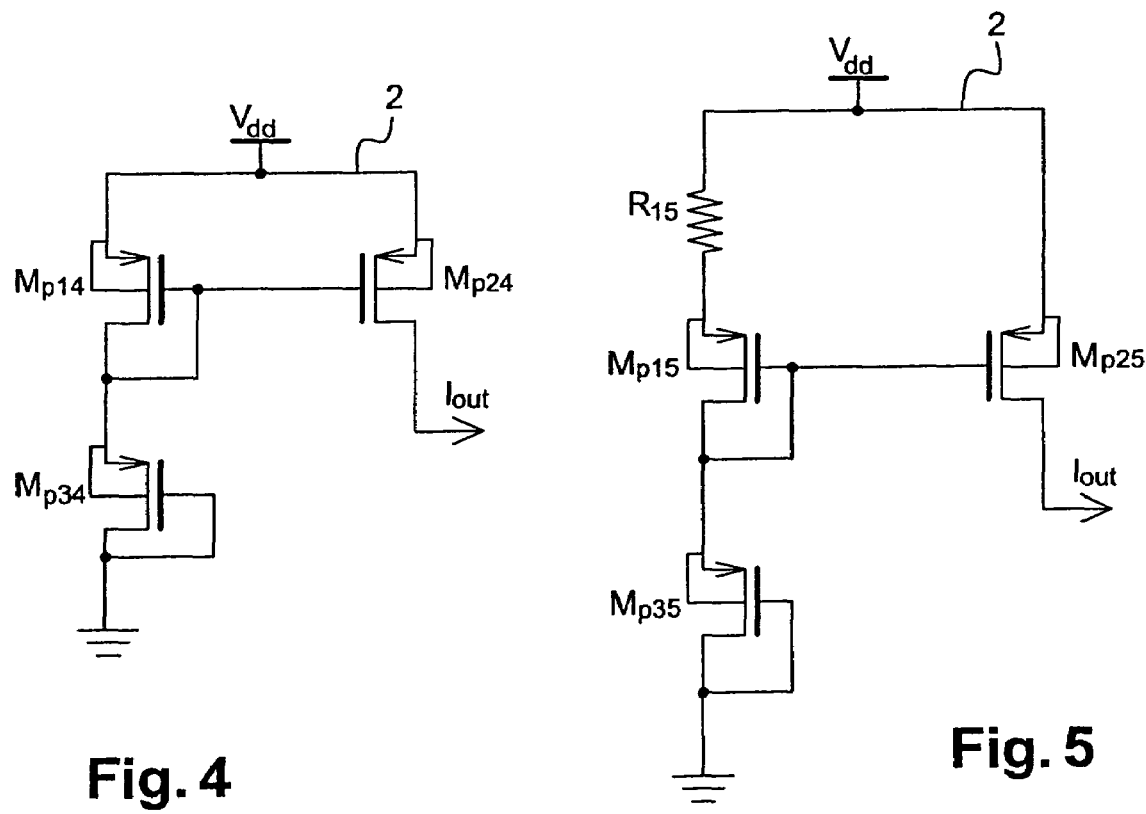
Fig. 4
Fig. 5

US 7,598,818 B2

TEMPERATURE COMPENSATION FOR A VOLTAGE-CONTROLLED OSCILLATOR

CROSS-REFERENCE TO RELATED APPLICATIONS

This application is based upon and claims priority from prior French Patent Application No. 04 09725, filed Sep. 14, 2004, the entire disclosure of which is herein incorporated by reference.

FIELD OF THE INVENTION

The present invention relates to voltage-controlled oscillators, such as those used by devices for radio frequency emissions.

BACKGROUND OF THE INVENTION

Applications employing wireless devices require low power analog circuits, powered by low voltages (for example, of about 1.5 V) and having maximum integration.

A commercially available device includes a phased-locked loop fitted with a voltage-controlled oscillator. The oscillator has a ring structure that includes a number of delay cells looped together. Its nominal oscillation frequency is 2.45 GHz. A transistor of the oscillator that operates as a current source is used to define its oscillation frequency.

An oscillator of this kind does, however, have drawbacks. For example, during an emission phase, the phased-locked loop can be open. The oscillation frequency then drifts to a value defined by external parameters, such as the temperature.

SUMMARY OF THE INVENTION

In view of these drawbacks, it is an object of the present invention to provide an improved oscillator.

One embodiment of the present invention provides an oscillator that includes an oscillating structure with a ring structure that includes delay cells looped together, and a compensation circuit coupled to the oscillating structure. The oscillator generates an output signal with a frequency that drifts as a function of the temperature of its environment. Each of the delay cells includes first through fifth transistors and first and resistances. The first transistor has its source coupled to a power supply and its gate receives a cell oscillation frequency control voltage. The first resistance is coupled between the power supply and a first output, and the second resistance is coupled between the power supply and a second output. The second transistor has its gate coupled to the second output, its source coupled to the drain of the first transistor and its drain coupled to the first output, and the third transistor has its gate coupled to the first output, its source coupled to the drain of the first transistor and its drain coupled to the second output. The fourth transistor has its gate coupled to a first input, its drain coupled to the first output and its source coupled to ground, and the fifth transistor has its gate coupled to a second input, its drain coupled to the second output and its source coupled to ground. The compensation circuit supplies a temperature compensation current that grows with the temperature to the first and second resistances of the delay cells in order to compensate for the drift in the frequency of the output signal generated by the oscillator.

Another embodiment of the present invention provides a phase-locked loop that includes such an oscillator, a phase comparator that receives a reference signal and the output signal generated by the oscillator, and a switch that selectively places the oscillator in an open loop or a closed loop. The phase comparator generates an oscillation frequency control voltage as a function of the difference between the reference signal and the output signal generated by the oscillator.

Yet another embodiment of the present invention provides a radio frequency send/receive device that includes such a phase-locked loop, a send circuit, a receive circuit, an aerial, and a control circuit. The control circuit places the oscillator in an open loop, applies the output signal generated by the oscillator to the send circuit and couples the send circuit to the aerial during a send phase, or places the oscillator in a closed loop, applies the output signal generated by the oscillator to the receive circuit and couples the receive circuit to the aerial during a receive phase.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 3 shows a ring oscillator fitted with a temperature compensation device according to one embodiment of the present invention;

FIGS. 4 to 7 show compensation devices according to alternative embodiments of the present invention;

DETAILED DESCRIPTION OF PREFERRED EMBODIMENTS

Figure 1:
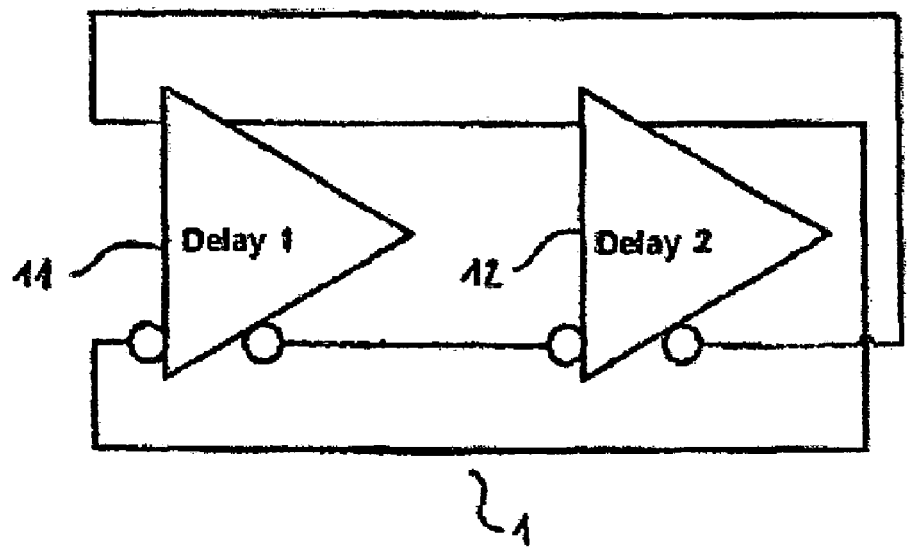
FIG. 1 shows an example of a ring oscillator.

Preferred embodiments of the present invention will be described in detail hereinbelow with reference to the attached drawings.

Preferred embodiments of the present invention provide an oscillator that includes an oscillating structure, a cell oscillation frequency voltage control, and another control. The oscillating structure generates a signal with a frequency that drifts as a function of a parameter of its environment, and the other control applies a compensation signal in the oscillating structure. This compensation signal varies as a function of changes in the parameter to compensate for the drift in the frequency of the generated signal.

In one embodiment, the oscillating structure has a ring structure including a number of delay cells looped together. Preferably, each delay cell includes first through fifth transistors and first and second resistances. The first transistor has a first electrode connected to a power supply and receives the control voltage at its control electrode. The first and second resistances are connected between the power supply and first and second outputs, respectively. The second and third transistors have their control electrodes connected to the second and the first outputs, respectively, with their first electrode being connected to the second electrode of the first transistor and their second electrode being connected to the first and second outputs, respectively. The fourth and fifth transistors have their control electrode connected to first and second inputs, respectively, with their first electrode being connected to the first and second outputs, respectively, and their second electrode being connected to ground.

In one embodiment, the first, second and third transistors are PMOS with the first electrode being the source, and the fourth and fifth transistors are NMOS with the first electrode being the drain.

In some embodiments, the parameter involving a drift is the temperature, and the other control includes an output that generates a current that grows with its temperature.

In one such embodiment, the other control includes sixth through eighth transistors. The sixth transistor is diode-connected with its first electrode connected to a power supply. The seventh transistor has its first electrode connected to a power supply, its second electrode applying the compensation signal in the oscillating structure and its control electrode connected to the control electrode of the sixth transistor. The eighth transistor has its first electrode connected to the second electrode of the sixth transistor, and its second electrode connected to ground. Preferably, the first electrode of the sixth transistor is connected to the power supply through a resistance, and the first electrode of the seventh transistor is connected to the power supply through a resistance. For example, the first electrode of the seventh transistor can be connected to the power supply through a ninth diode-connected transistor.

In one embodiment, the second electrodes of the seventh and eighth transistors are connected by a capacitor.

Preferably, the transistors of the other control are PMOS transistors.

In one embodiment, the other control applies the compensation signal to the first and second resistances of the delay cells.

The present invention also provides a phase-locked loop that includes such an oscillator, a phase comparator, and a switch that selectively places the oscillator in an open loop or a closed loop. The phase comparator receives the signal generated by the oscillator and a reference signal, and generates an oscillation frequency voltage control as a function of the difference between the input signal and the generated signal.

The present invention also provides a radio frequency send/receive device that includes such a phase-locked loop in which the oscillator generates a radio frequency signal, a send circuit, a receive circuit, an aerial, and a control circuit. The control circuit places the oscillator in an open loop, applying the generated signal to the send circuit and connecting the send circuit to the aerial during a send phase; and places the oscillator in a closed loop, applying the generated signal to the receive circuit and connecting the receive circuit to the aerial during a receive phase.

Generally, embodiments of the present invention fit an oscillator that has a voltage control with a device that compensates for the frequency drift that arises out of the variation of a parameter of its environment.

The present invention will now be described for the exemplary case of an oscillator having an oscillating ring structure 1, as shown in FIG. 1. The oscillating structure uses the delay of inverters 11 and 12 that are identical and looped together.

Figure 2:
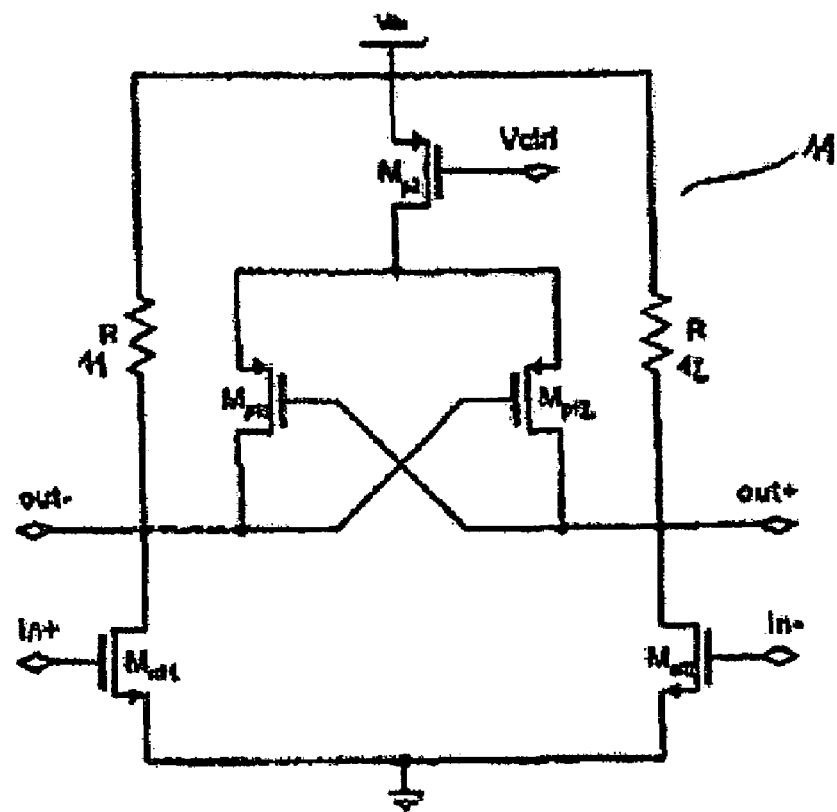
FIG. 2 shows the detail of one oscillator cell in the ring of FIG. 1.

FIG. 2 shows an example of a cell 11 in the oscillating structure 1. The cell 11 has a pair of NMOS transistors Mn11 and Mn12, which are used as a differential input pair. The cell 11 also has a pair of positive feedback PMOS transistors Mp11 and Mp12. The cell also has a PMOS transistor Mp2, which operates as a current source: the voltage control $V_{ctrl}$ received at its gate is converted into a control current. The Vdd power supply is coupled to the out− and out+ outputs through the resistances R11 and R12, respectively.

To be more exact, the source of Mp2 is connected to the Vdd power supply, its gate is connected to a control voltage input, and its drain is connected to the source of the transistors Mp11 and Mp12. The drain of Mp11 is connected to the out− output, to the gate of Mp12 and to the drain of Mp11. The drain of Mp12 is connected to the out+ output, to the gate of Mp11 and to the drain of Mp12. The source of the transistors Mp11 and Mp12 is connected to the Vss voltage.

The cell 11 has a particularly straightforward structure. Additionally, its symmetry makes it possible to reduce the occupied silicon surface and provides an excellent matching of the transistors (the incidence of drifting from its manufacturing process is therefore reduced).

The operation of the cell is as follows. The transconductance gmp1 of the transistors Mp11 and Mp12 is controlled by the current of the transistor Mp2. The variation in transconductance of Mp11 and Mp12 is reproduced on the transistors Mn11 and Mn12. The resistances R11 and R12 inject a constant current into the drain of the transistors Mn11 and Mn12. The current applied by the resistances R11 and R12 to Mn11 and Mn12 makes it possible to adjust the gmn1/gmp1 ratio. The frequency is therefore controlled by controlling the transconductance of Mp2.

The transfer function of the cell 11 of FIG. 2 is as follows.

$$A(s) = \frac{Vout}{Vin} = \frac{gmn1 * Req * \left(1 + s * \frac{Cgsn1}{gmn1}\right)}{(1 - Req * gmp1) * \left(1 + s * \frac{Req * (4Cgdp1 + C)}{1 - Req * gmp1}\right)}$$

where Vout is the differential output voltage, Vin is the differential input voltage, Req is the value equating to the resistances rdsn1, rdsp1 and R in parallel, rdsn1 is the drain-to-source resistance of the transistors Mn11 and Mn12, rdsp1 is the drain-to-source resistance of the transistors Mp11 and Mp12, gmn1 is the transconductance of the transistors Mn11 and Mn12, C is the sum of the capacitances Cdbn1, Cgsp1 and Cdbp1, cdbn1 is the drain-to-substrate capacitance of the transistors Mn11 and Mn12, cgsp1 is the gate-to-source capacitance of the transistors Mp11 and Mp12, and cdbp1 is the drain-to-substrate capacitance of the transistors Mp11 and Mp12.

According to the Barkhausen criterion, in order to maintain oscillation, the total phase shift of the phase-locked chain must be 360° with a gain in unit voltage. The rated frequency can then be deduced from this.

$$fosc = \frac{1}{2\pi} \sqrt{\frac{gmn1^2 - \left(\frac{1}{R} - gmp1\right)^2}{(C + 4Cgdp1)^2 - Cgsn1^2}}$$

A description will now be given of compensation devices with respect to the particular case of temperature drift.

FIG. 3 shows an oscillator that includes an oscillating structure 1 and a temperature compensation device 2. As described above, the oscillating structure 1 receives a control voltage $V_{ctrl}$ at one input. The oscillating structure supplies to one output a signal at the fosc frequency in accordance with the following law (first order).

$$fosc = Kvco * Vctrl$$

with Kvco being the gain from the voltage-to-frequency conversion of the oscillator. For a given voltage $V_{ctrl}$ and in the absence of compensation, the Kvco gain drops and leads to a linear drop in fosc when the temperature increases.

The compensation device 2 is provided so as to apply a polarization current, which is proportionate to absolute temperature, to the oscillating structure.

The temperature compensation device of FIG. 4 has three PMOS transistors Mp14, Mp24 and Mp34. The transistors Mp14 and Mp34 are diode-connected. The source of the transistor Mp14 is connected to the Vdd power supply, and its drain is connected to the source of the transistor Mp34. The drain of the transistor Mp34 is connected to the Vss voltage. The source of the transistor Mp24 is connected to the Vdd power supply, its drain is connected to an output Iout and its gate is connected to the gate of Mp14. The transistor Mp24 is therefore connected to copy the current passing through Mp14 to the output Iout.

The output voltage Iout is therefore defined by the following formula.

$$Iout = \mu P * Cox * \frac{Wp2}{2Lp2} * \frac{Vdd}{1 + \sqrt{\frac{Wp1/Lp1}{Wp3/Lp3}}}$$

where $\mu P$ is the mobility of the holes, Cox is the oxide capacitance, and Wp and Lp are the width and the length, respectively, of the channel of the transistors.

Thus, in this example, Iout varies as a function of the temperature since $\mu P$ is approximately proportional to absolute temperature.

The temperature compensation device of FIG. 5 allows the influence of the temperature on the current Iout to be increased. To this end, the source of the transistor Mp15 is connected to the Vdd power supply through the resistance R15.

$$Iout = \mu P * Cox * \frac{Wp2}{2Lp2} * (Vdd - Va - |Vt|)$$

with $$Va = \frac{(2R * |Vt| * \sqrt{\beta 1 * \beta 3}) + \sqrt{\Delta}}{2R * \sqrt{\beta 1 * \beta 3}}$$

$$\Delta = \sqrt{\beta 3} * (1 - 2R * |Vt| * \sqrt{\beta 1 * \beta 3})^2 - 4R * \sqrt{\beta 1 * \beta 3} *$$
$$|(\sqrt{\beta 1} - \sqrt{\beta 3}) * |Vt| + R * |Vt|^2 * \beta 3 * \sqrt{\beta 1} - \sqrt{\beta 1 * Vdd}|$$

and $$\beta = \mu p * Cox * \frac{W}{2L}$$

Figure 6:
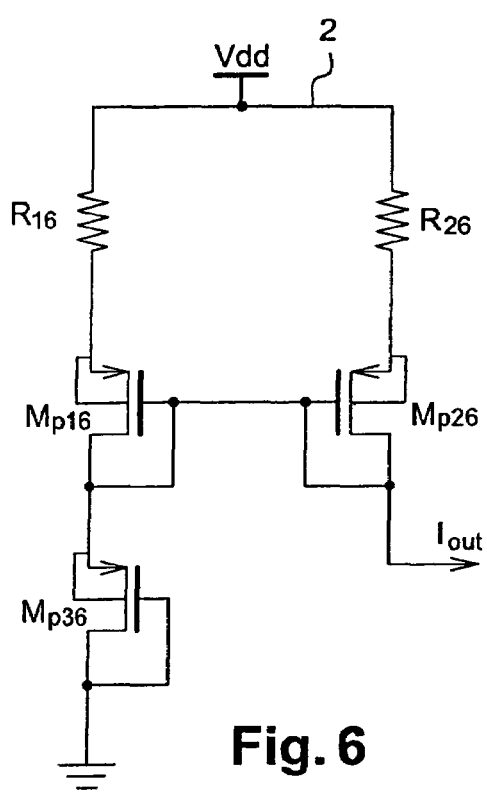

The temperature compensation device of FIG. 6 promotes control of the fall-off and the value of the output current Iout. To this end, the source of the transistor Mp26 is connected to the Vdd power supply through the resistance R26. This modification allows the temperature compensation to be adjusted but reduces the current variation range.

Figure 7:
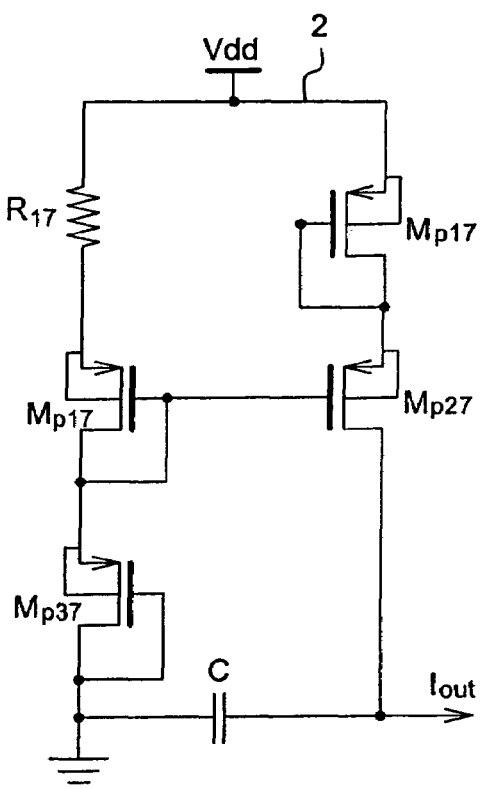

Compared with the temperature compensation device of FIG. 6, the temperature compensation device of FIG. 7 increases the influence of the temperature over the current Iout and reduces the sensitivity of the device to the impedance which is connected to it. To this end, a diode-connected transistor Mp47 replaces the resistance R26 for an equivalent function. Furthermore, a capacitor C connects the drain of the transistor Mp37 and the drain of the transistor Mp27. Power supply rejection is therefore improved.

The compensation device 2 of FIG. 7 is, for example, expected to provide current compensation of 7.4 μA/° C. (i.e., 1.4 mA in the range from −40° C. to 150° C.).

In these examples transistors of the PMOS type are preferably used. Flicker noise, the power spectral density of which varies in reverse direction to the frequency, is reduced for a given polarization current. The source and the substrate can be directly connected and therefore the threshold voltage will not vary as a function of the transistor polarization point. The linearity of the compensation circuit is thereby increased.

In further embodiments, the transistors $M_{p3x}$ in FIGS. 4 to 7 are replaced by equivalent transistors of the NMOS type.

Although the devices described above have a linear compensation as a function of the temperature, one of ordinary skill in the art can easily adapt these devices in order to obtain a pattern which corresponds to the temperature drifts of the oscillating structure.

Figure 9:
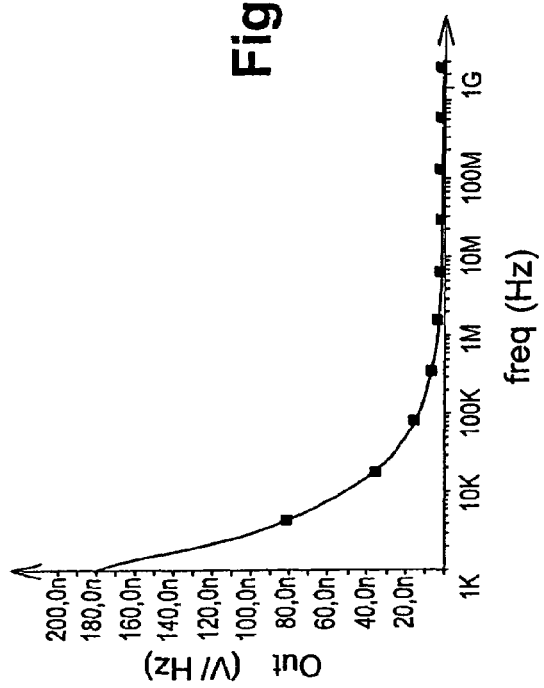
FIGS. 8 and 9 are diagrams illustrating the performance of the compensation device of FIG. 7.
Figure 8:
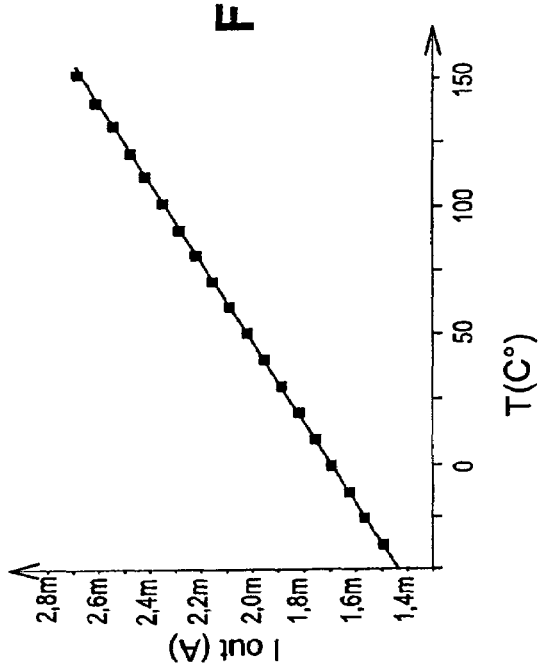

FIGS. 8 and 9 show the performance of the compensation device of FIG. 7. FIG. 8 shows the variation in the output current Iout as a function of the temperature. As shown, the relationship between the temperature and Iout is highly linear. FIG. 9 shows the output noise of the compensation device. The figure shows that this noise is at a particularly low level.

Figure 10:
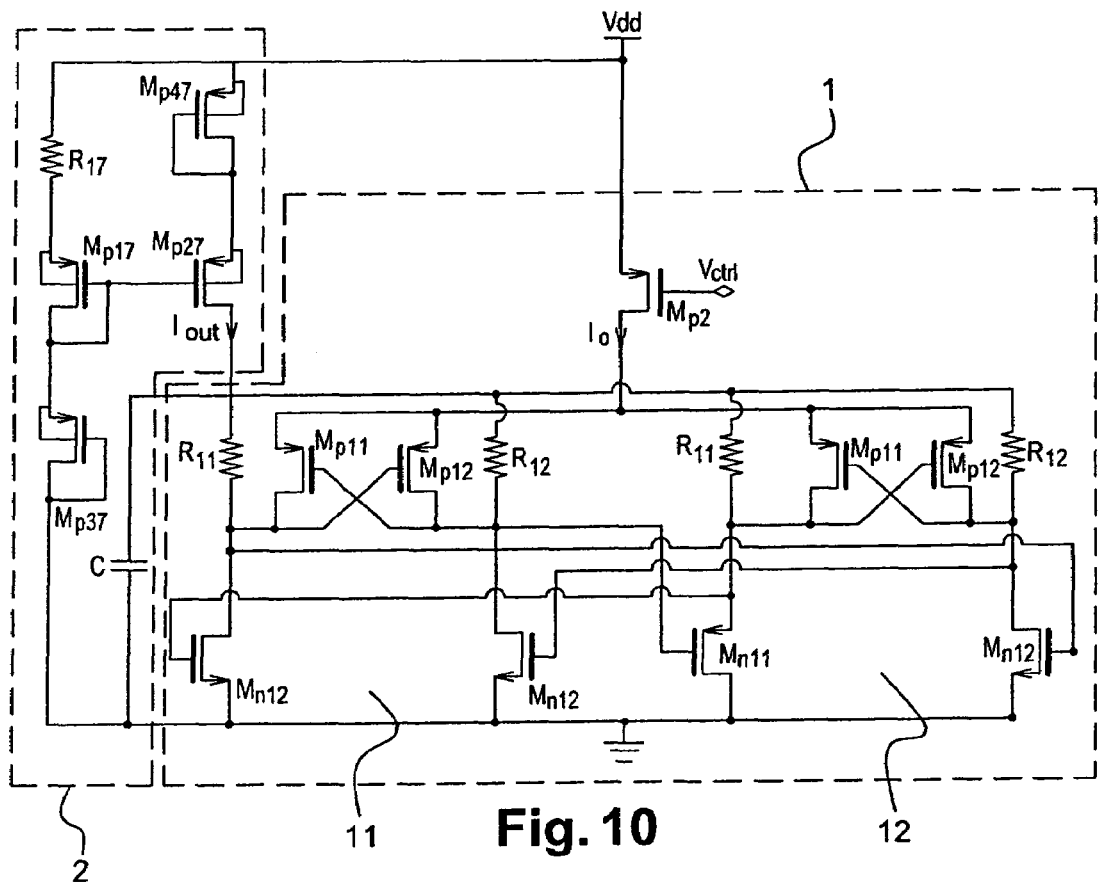
FIG. 10 shows in detail an oscillator fitted with the device of FIG. 7.

FIG. 10 shows an oscillator fitted with the compensation device of FIG. 7. The compensation device 2 is connected in series between the resistances R11 and R12 and the Vdd power supply. The oscillator has a particularly straightforward structure, with only thirteen transistors, five resistances and a capacitor.

One of ordinary skill in the art can easily adapt the value of the resistances R11 and R12 so as to allow the rated frequency to be aligned to the required value. In this exemplary embodiment, components with the same reference numbers are identical, give or take variations in manufacture.

The transistor Mp2 is used to convert the voltage $V_{ctrl}$ into current $I_0$ that controls the cells 11 and 12. By applying the variable current Iout in the resistances R11 and R12, the temperature is compensated for by modifying the polarization current of the transistors Mn12 and Mn11.

In this way, for a given value of $V_{ctrl}$, the frequency of the signal generated by the oscillator will be affected very little by variations in temperature.

FIGS. 11 to 16 show the performance of the oscillator of FIG. 8 and a similar oscillator without a compensation device. The curves connecting squares correspond to the oscillator of FIG. 8. The curves connecting diamonds correspond to the oscillator without compensation.

The tests have been carried out under the following basic operating conditions: a temperature of 50° C., a VDD supply voltage of 2.5 V, and a control voltage $V_{ctrl}$ of 1 V.

Figure 11:
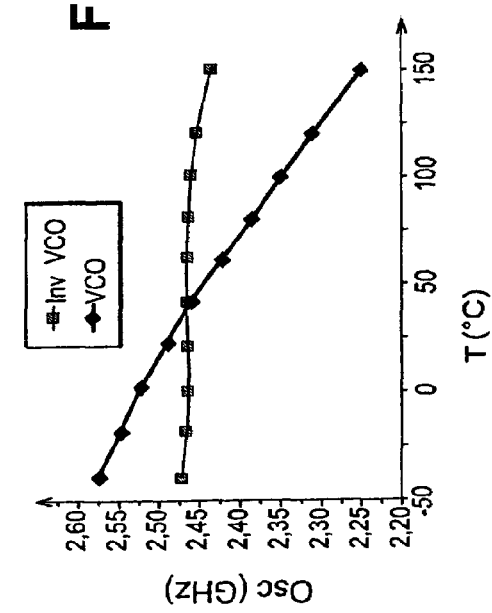

FIG. 11 shows the oscillation frequency stabilized in an open loop as a function of the temperature. The oscillator of FIG. 8 has only one temperature drift of about 50 ppm/° C., which implies a drift of about 25 MHz over the temperature range between −40° C. and 150° C. for a rated frequency of 2.45 GHz. By comparison the oscillator without compensation has a drift of 950 ppm/° C. (i.e., about 450 MHz under the same conditions).

Figure 12:
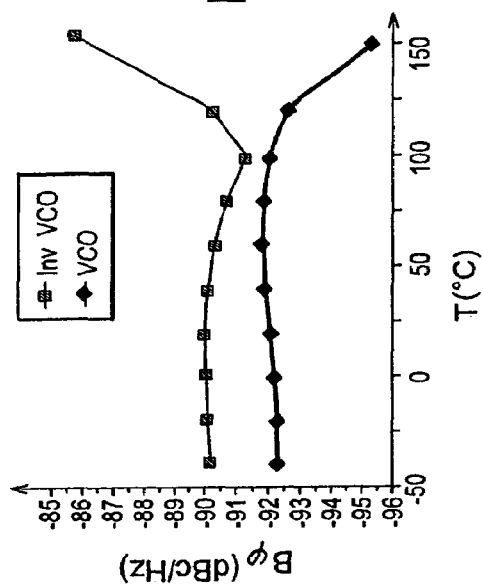
FIGS. 11 to 16 are diagrams comparing the performance of an oscillator with and without a compensation device.

FIG. 12 shows the phase noise in a closed loop as a function of the temperature at 500 kHz from the carrier frequency. As shown, the phase noise of the oscillator of FIG. 8 is degraded relatively little. Thus, over the range of −40 to 100° C., the phase noise of the oscillator of FIG. 8 does not exceed the phase noise of the oscillator without compensation by more than 2 dBc/Hz. Although the discrepancy between the phase noises increases above 100° C., the incidence of this is relatively limited since the oscillator is generally provided for applications at a temperature below 85° C. However, the performance of the compensated oscillator is better than that required by the Bluetooth standard over the whole of the temperature range. The phase noise remains moreover relatively stable over the temperature range between −40° C. and 120° C.

Figure 13:
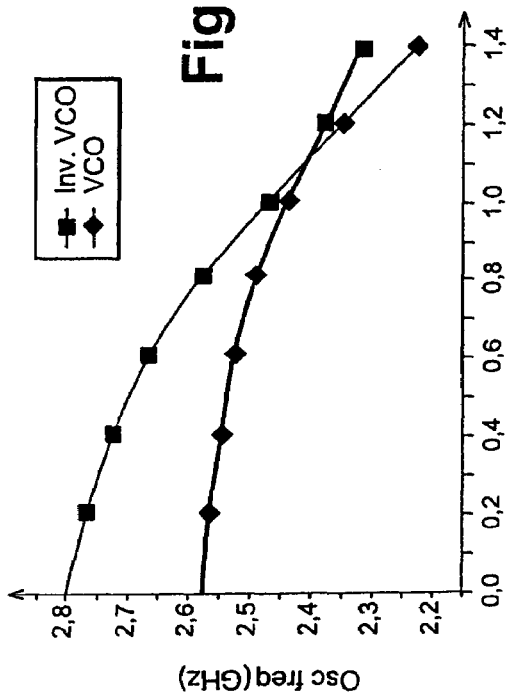

FIG. 13 shows the oscillation frequency as a function of the voltage level $V_{ctrl}$. As shown, the compensation device provides an increased conversion gain Kvco. Consequently, the oscillating structure gain may be reduced. The effect of control voltage leaks is therefore reduced proportionate to the reduction in the gain. Additionally, the modulations of the control voltage are less noise sensitive. Furthermore, the range of linearity of the transfer function is considerably increased.

Figure 14:
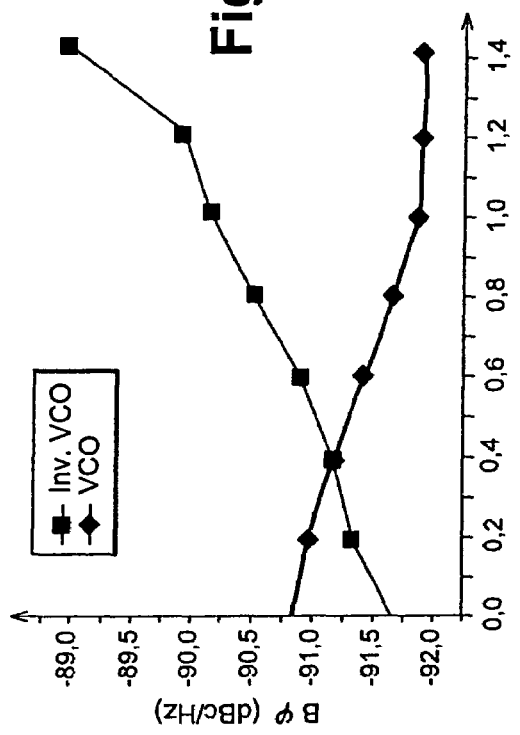

FIG. 14 shows the noise phase at 500 kHz from the carrier frequency, as a function of the level of the voltage $V_{ctrl}$. The phase noise of the oscillator of FIG. 8 remains below −89 dBc/Hz over the voltage $V_{ctrl}$ range tested.

Figure 15:
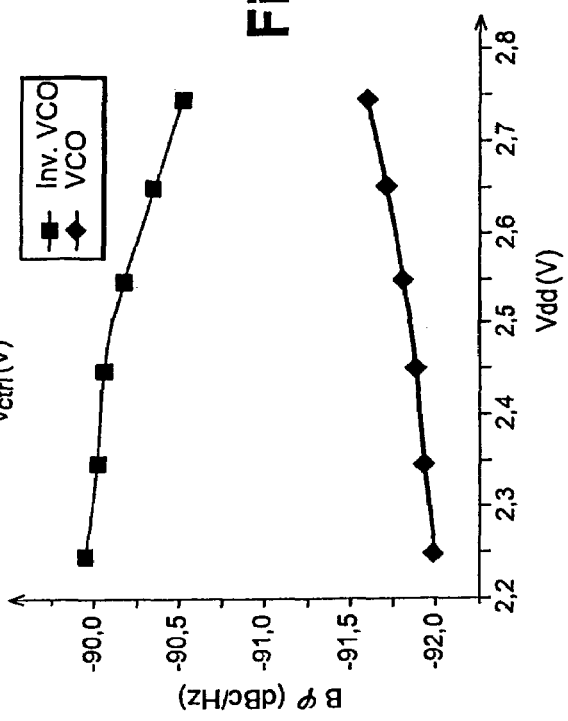

FIG. 15 shows the noise phase at 500 KHz from the carrier frequency, as a function of the level of the VDD supply voltage. The degradation of the phase noise remains below 2 dBc/Hz over the whole range tested. Moreover, the phase noise also remains clearly below the level required by the Bluetooth standard.

Figure 16:
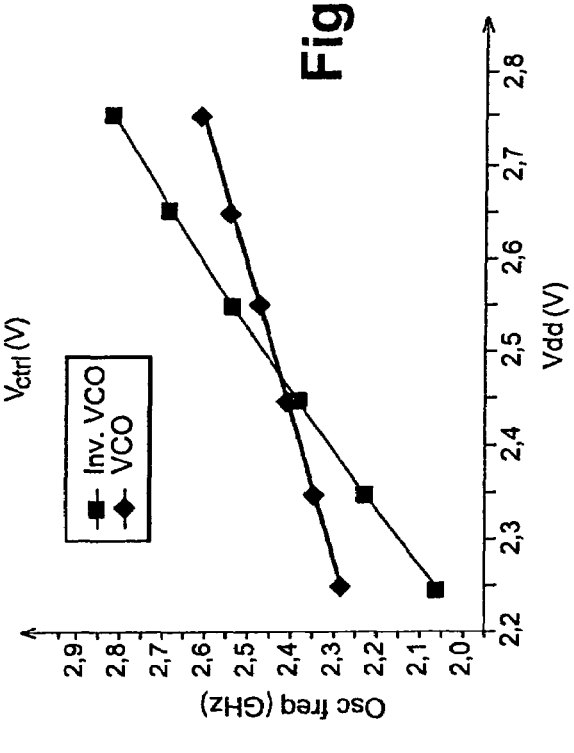

FIG. 16 shows the frequency of the oscillator as a function of the supply voltage. The oscillator of FIG. 8 is more sensitive to the variation in the supply voltage than the oscillator without compensation. However, the incidence of this increase in sensitivity is small in terms of the operation of the oscillator.

The power consumed by the oscillator without compensation is 10 mW as opposed to 15.5 mW for an oscillator with temperature compensation. The loss in terms of power is extremely small compared with the gains in performance that are obtained.

It was also found that the time for establishing the oscillation increases from 3 ns without compensation to 5 ns for an oscillator with temperature compensation. Thus, the establishment time is degraded only by a very small order of magnitude. This establishment time degradation will more often than not be negligible when compared with the order of magnitude of the other delays in the circuit coupled to the oscillator. It was further found that the phase noise as a function of the shift frequency was unchanged by the temperature compensation.

Figure 17:
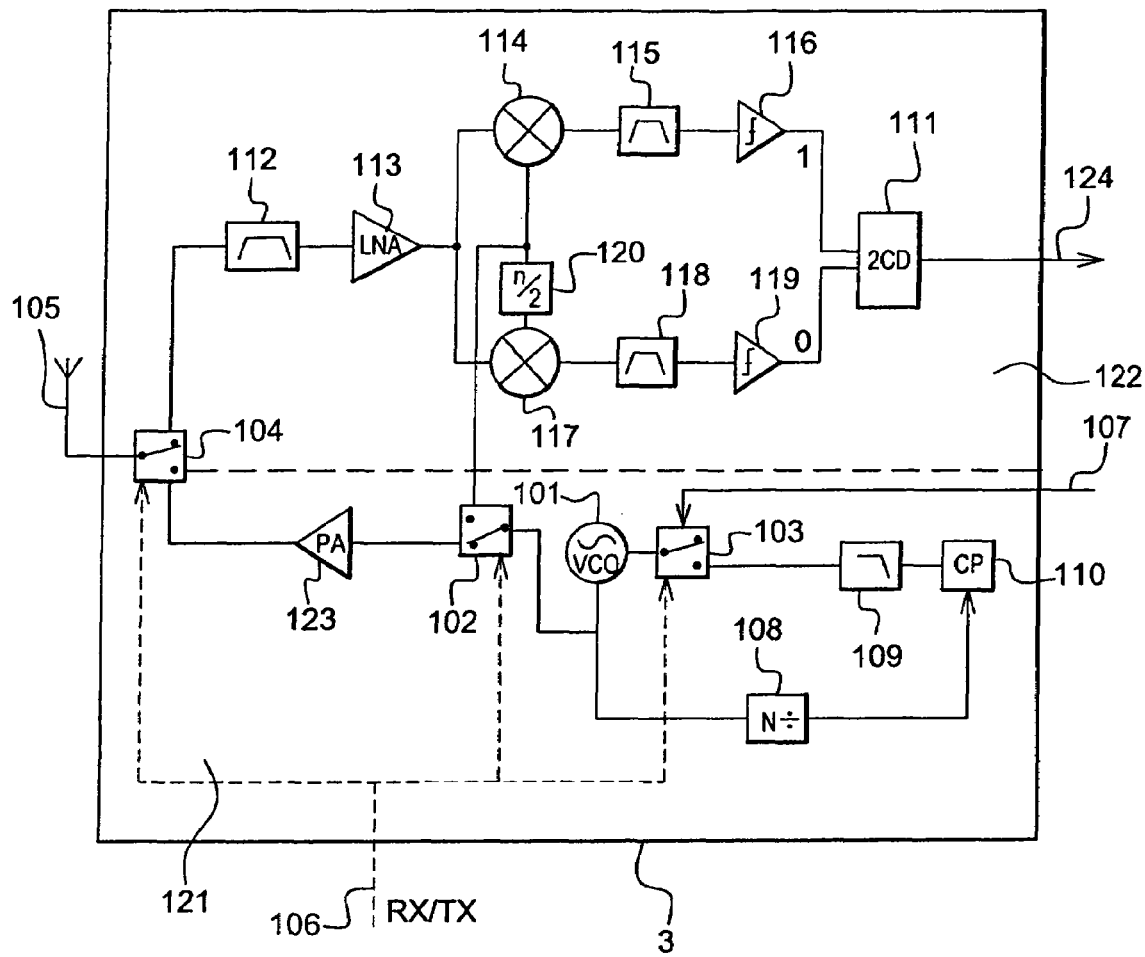
FIG. 17 shows an exemplary integrated send/receive circuit that includes such an oscillator.

FIG. 17 shows an oscillator according to an embodiment of the present invention integrated into a radio frequency send/receive device 3. The oscillator can be integrated in CMOS technology with the remainder of the send/receive device 3.

The device 3 includes a send and receive aerial 105. The aerial is selectively coupled to a receive circuit 122 or to a send circuit 121 through a switch 104. Switching (and therefore the communication mode) is controlled by the application of a signal RX/TX to an input 106. The send circuit 121 receives binary data to modulate and send from an input 107 of the device 3. The receive circuit 122 supplies demodulated received binary data to an output 124.

The receive circuit 122 and the send circuit 121 use one and the same VCO oscillator 101 of an embodiment of the present invention.

In receive mode, the oscillator 101 with the compensation device is placed in a closed loop in a phase-locked loop, by the switch 103. This loop includes a voltage divider 108 which receives the signal generated by the oscillator 101. The divided signal is supplied to a phase comparator 110. The phase comparator 110 compares the signal of the oscillator with a reference frequency value (corresponding to the frequency to be generated divided by the factor N of the divider). The comparator then generates a control voltage for the corrected oscillator. This control voltage passes through a filter 109 and the filtered voltage $V_{ctrl}$ is thus stabilized in order to drive the VCO oscillator 101. The control voltage can, for example, be generated by a charge pump powering a capacitance. The capacitance is then charged or discharged as a function of the required correction to the control voltage.

Still in receive mode, the signal received by the aerial 105 passes through a band pass filter 112. The filter thus retains only a narrow band including the signals frequency modulated to 2.5 GHz±2 MHz. The filtered signal then passes through a low noise amplifier 113. The output of the amplifier 113 is connected to the phase comparators 114 and 117 of a demodulation circuit.

The signal generated by the oscillator 101 is supplied to the receive circuit 122 through the switch 102. The generated signal is applied to two branches of the demodulation circuit. For the branch associated with the detection of 0, the generated signal passes through a phase shifter +π/2, and is then applied to the phase comparator 117. The output of the comparator 117 is applied to a filter 118. The output of the filter 118 is applied to a threshold comparator 119. For the branch associated with the detection of 1, the generated signal is applied to the phase comparator 114. The output of the comparator 114 is applied to a filter 115. The output of the filter 115 is applied to a threshold comparator 116. The comparators 116 and 119 are connected to the circuit 111 which provides the demodulated binary signal to the output 124.

In send mode, the phase-locked loop including the oscillator 101 is placed in an open loop by the switch 103. The oscillator receives a control voltage modulated in amplitude as a function of the logic level. This voltage is applied as a control voltage to the oscillator 101 through the switch 103. In send mode, the switch 102 applies the signal generated by the oscillator 101 to a power amplifier 123. The switch 104 applies the output signal of the amplifier 123 to the aerial 105. Provision may be made for the receive circuit 122 to be switched off in send mode in order to reduce the electrical power consumption of the device. In receive mode provision may be made for the power amplifier 123 not to be powered up.

The compensated oscillator 101 proves to be particularly useful in the send/receive device 3. Indeed, since the phase-locked loop is open in send mode, the temperature of the oscillator increases particularly on account of the power being supplied to the power amplifier 123. The compensation device thus allows the temperature drift of the oscillator in an open loop to be compensated for. The device can then send signals while complying with error standards with respect to the send frequency. Temperature drift is then negligible when compared with other emission disturbances.

Preferably, the send mode is reduced to the minimum. In this way, even if a compensation circuit makes it possible to remain within the limitations of error only during a preset period of time, this period of time may be longer than the period of time of the send mode.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An oscillator comprising:
   an oscillating structure with a ring structure, the oscillating structure including at least one first transistor of the PMOS type with its source coupled to a positive power supply node and its gate receiving a cell oscillation frequency control voltage, and a plurality of delay cells looped together, the oscillator generating an output signal with a frequency that drifts as a function of the temperature of its environment, each of the delay cells including:
      a first resistance coupled between the positive power supply node and a first output;
      a second resistance coupled between the positive power supply node and a second output;
      a second transistor of the PMOS type with its gate coupled to the second output, its source coupled to the drain of the first transistor and its drain coupled to the first output;
      a third transistor of the PMOS type with its gate coupled to the first output, its source coupled to the drain of the first transistor and its drain coupled to the second output;
      a fourth transistor of the NMOS type with its gate coupled to a first input such that the fourth transistor is controlled based on a voltage at the first input, the drain of the fourth transistor being coupled to the first output and the source of the fourth transistor being coupled to a ground node; and
      a fifth transistor of the NMOS type with its gate coupled to a second input such that the fifth transistor is controlled based on a voltage at the second input, the drain of the fifth transistor being coupled to the second output and the source of the fifth transistor being coupled to the ground node; and
   a compensation circuit coupled to the oscillating structure, the compensation circuit supplying a temperature compensation current that grows with the temperature to the first and second resistances of the delay cells in order to compensate for the drift in the frequency of the output signal generated by the oscillator.

2. The oscillator according to claim 1, wherein the compensation circuit includes:
   a sixth transistor that is diode-connected and has its first electrode coupled to the positive power supply node;
   a seventh transistor with its first electrode coupled to the positive power supply node, its second electrode supplying the temperature compensation current and its control electrode coupled to a control electrode of the sixth transistor; and
   an eighth transistor with its first electrode coupled to a second electrode of the sixth transistor and its second electrode coupled to the ground node.

3. The oscillator according to claim 2, wherein the first electrode of the sixth transistor is coupled to the positive power supply node through a third resistance.

4. The oscillator according to claim 3, wherein the first electrode of the seventh transistor is coupled to the positive power supply node through a fourth resistance.

5. The oscillator according to claim 3, wherein the first electrode of the seventh transistor is coupled to the positive power supply node through a ninth transistor that is diode-connected.

6. The oscillator according to claim 5, wherein the second electrode of the seventh transistor is coupled to the second electrode of the eighth transistor through a capacitor.

7. The oscillator according to claim 2, wherein the second electrode of the seventh transistor is coupled to the second electrode of the eighth transistor through a capacitor.

8. The oscillator according to claim 2, wherein the sixth, seventh and eighth transistors are transistors of the PMOS type.

9. A phase-locked loop comprising:
   an oscillator including:
      an oscillating structure with a ring structure, the oscillating structure including at least one first transistor of the PMOS type with its source coupled to a positive power supply node and its gate receiving a cell oscillation frequency control voltage, and a plurality of delay cells looped together, the oscillator generating an output signal with a frequency that drifts as a function of the temperature of its environment, each of the delay cells including:
         a first resistance coupled between the positive power supply node and a first output;
         a second resistance coupled between the positive power supply node and a second output;
         a second transistor of the PMOS type with its gate coupled to the second output, its source coupled to the drain of the first transistor and its drain coupled to the first output;
         a third transistor of the PMOS type with its gate coupled to the first output, its source coupled to the drain of the first transistor and its drain coupled to the second output;
         a fourth transistor of the NMOS type with its gate coupled to a first input such that the fourth transistor is controlled based on a voltage at the first input, the drain of the fourth transistor being coupled to the first output and the source of the fourth transistor being coupled to a ground node; and
         a fifth transistor of the NMOS type with its gate coupled to a second input such that the fifth transistor is controlled based on a voltage at the second input, the drain of the fifth transistor being coupled to the second output and its the source of the fifth transistor being coupled to the ground node; and
      a compensation circuit coupled to the oscillating structure, the compensation circuit supplying a temperature compensation current that grows with the temperature to the first and second resistances of the delay cells in order to compensate for the drift in the frequency of the output signal generated by the oscillator;
   a phase comparator receiving a reference signal and the output signal generated by the oscillator, the phase comparator generating an oscillation frequency control voltage as a function of the difference between the reference signal and the output signal generated by the oscillator; and a switch selectively placing the oscillator in an open loop or a closed loop.

10. The phase-locked loop according to claim 9, wherein the compensation circuit of the oscillator includes:
a sixth transistor that is diode-connected and has its first electrode coupled to the positive power supply node;
a seventh transistor with its first electrode coupled to the positive power supply node, its second electrode supplying the temperature compensation current and its control electrode coupled to a control electrode of the sixth transistor; and
an eighth transistor with its first electrode coupled to a second electrode of the sixth transistor and its second electrode coupled to the ground node.

11. The phase-locked loop according to claim 10, wherein the first electrode of the sixth transistor of the compensation circuit of the oscillator is coupled to the positive power supply node through a third resistance.

12. The phase-locked loop according to claim 11, wherein the first electrode of the seventh transistor of the compensation circuit of the oscillator is coupled to the positive power supply node through a fourth resistance.

13. The phase-locked loop according to claim 11, wherein the first electrode of the seventh transistor of the compensation circuit of the oscillator is coupled to the positive power supply node through a ninth transistor that is diode-connected.

14. The phase-locked loop according to claim 10, wherein the second electrode of the seventh transistor of the compensation circuit of the oscillator is coupled to the second electrode of the eighth transistor of the compensation circuit of the oscillator through a capacitor.

15. A radio frequency send/receive device comprising:
a send circuit;
a receive circuit;
an aerial coupled to the send circuit and the receive circuit;
a phase-locked loop including:
an oscillator including:
an oscillating structure with a ring structure, the oscillating structure including at least one first transistor of the PMOS type with its source coupled to a positive power supply node and its gate receiving a cell oscillation frequency control voltage, and a plurality of delay cells looped together, the oscillator generating a radio frequency output signal with a frequency that drifts as a function of the temperature of its environment, each of the delay cells including:
a first resistance coupled between the positive power supply node and a first output;
a second resistance coupled between the positive power supply node and a second output;
a second transistor of the PMOS type with its gate coupled to the second output, its source coupled to the drain of the first transistor and its drain coupled to the first output;
a third transistor of the PMOS type with its gate coupled to the first output, its source coupled to the drain of the first transistor and its drain coupled to the second output;
a fourth transistor of the NMOS type with its gate coupled to a first input such that the fourth transistor is controlled based on a voltage at the first input, the drain of the fourth transistor being coupled to the first output and the source of the fourth transistor being coupled to a ground node; and
a fifth transistor of the NMOS type with its gate coupled to a second input such that the fifth transistor is controlled based on a voltage at the second input, the drain of the fifth transistor being coupled to the second output and the source of the fifth transistor being coupled to the ground node; and
a compensation circuit coupled to the oscillating structure, the compensation circuit supplying a temperature compensation current that grows with the temperature to the first and second resistances of the delay cells in order to compensate for the drift in the frequency of the output signal generated by the oscillator;
a phase comparator receiving a reference signal and the output signal generated by the oscillator, the phase comparator generating an oscillation frequency control voltage as a function of the difference between the reference signal and the output signal generated by the oscillator; and
a switch selectively placing the oscillator in an open loop or a closed loop; and
a control circuit for:
placing the oscillator in an open loop, applying the output signal generated by the oscillator to the send circuit and coupling the send circuit to the aerial during a send phase; and
placing the oscillator in a closed loop, applying the output signal generated by the oscillator to the receive circuit and coupling the receive circuit to the aerial during a receive phase.

16. The send/receive device according to claim 15, wherein the compensation circuit of the oscillator of the phase-locked loop includes:
a sixth transistor that is diode-connected and has its first electrode coupled to the positive power supply node;
a seventh transistor with its first electrode coupled to the positive power supply node, its second electrode supplying the temperature compensation current and its control electrode coupled to a control electrode of the sixth transistor; and
an eighth transistor with its first electrode coupled to a second electrode of the sixth transistor and its second electrode coupled to the ground node.

17. The send/receive device according to claim 16, wherein the first electrode of the sixth transistor of the compensation circuit of the oscillator of the phase-locked loop is coupled to the positive power supply node through a third resistance.

18. The send/receive device according to claim 17, wherein the first electrode of the seventh transistor of the compensation circuit of the oscillator of the phase-locked loop is coupled to the positive power supply node through a fourth resistance.

19. The send/receive device according to claim 17, wherein the first electrode of the seventh transistor of the compensation circuit of the oscillator of the phase-locked loop is coupled to the positive power supply node through a ninth transistor that is diode-connected.

20. The send/receive device according to claim 16, wherein the second electrode of the seventh transistor of the compensation circuit of the oscillator of the phase-locked loop is coupled to the second electrode of the eighth transistor of the compensation circuit of the oscillator of the phase-locked loop through a capacitor.

21. The oscillator according to claim 1,
wherein the first resistance is directly connected to the first output, and the second resistance is directly connected to the second output.

22. The oscillator according to claim 1,
wherein the first resistance comprises a first resistor that is coupled between the compensation circuit and the first output, and
the second resistance comprises a second resistor that is coupled between the compensation circuit and the second output.

23. The oscillator according to claim 1,
wherein the gate of the fourth transistor is directly connected to the first input, and
the gate of the fifth transistor is directly connected to the second input.

24. The oscillator according to claim 2,
wherein the second electrode of the seventh transistor is directly connected to both the first resistance and the second resistance, and
the compensation circuit supplies the temperature compensation current directly to the first and second resistances.

25. The oscillator according to claim 1,
wherein the compensation circuit includes a seventh transistor with its first electrode coupled to the positive power supply node, and its second electrode directly connected to both the first resistance and the second resistance, and
the second electrode of the seventh transistor supplies the temperature compensation current directly to the first and second resistances.

26. The oscillator according to claim 1,
wherein the dram of the fourth transistor is directly connected to the drain of the second transistor and is directly connected to the first resistance, and
the drain of the fifth transistor is directly connected to the drain of the third transistor and is directly connected to the second resistance.

27. The oscillator according to claim 1,
wherein the first resistance has a first terminal that is directly connected to the first output and a second terminal that is directly connected to the compensation circuit and
wherein the second resistance has a first terminal that is directly connected to the second output and a second terminal that is directly connected to the first terminal of the first resistance and directly connected to the compensation circuit.

28. The oscillator according to claim 1,
wherein the first resistance has a first terminal that is coupled to the positive power supply node and the second resistance has a first terminal that is coupled to the positive power supply node,
the compensation circuit supplies the temperature compensation current directly to the first terminal of the first resistance and the first terminal of the second resistance.

* * * * *